United States Patent
Wang et al.

(10) Patent No.: US 7,843,300 B2
(45) Date of Patent: Nov. 30, 2010

(54) FILTER AND COIL CONNECTING FRAME THEREOF

(75) Inventors: Jun Wang, Taoyuan Hsien (TW); Xin-Hua Li, Taoyuan Hsien (TW); Han-Cheng Hsu, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 973 days.

(21) Appl. No.: 11/700,877

(22) Filed: Feb. 1, 2007

(65) Prior Publication Data

US 2007/0194875 A1 Aug. 23, 2007

(30) Foreign Application Priority Data

Feb. 17, 2006 (TW) .............................. 95105316 A

(51) Int. Cl.
*H01F 27/29* (2006.01)
(52) U.S. Cl. ...................................... 336/192
(58) Field of Classification Search ............... 336/65, 336/90–96, 192, 198, 200, 232; 333/180–185
See application file for complete search history.

(56) References Cited

U.S. PATENT DOCUMENTS

| | | | | |
|---|---|---|---|---|
| 3,721,747 A | * | 3/1973 | Renskers | .................... 174/532 |
| 4,275,368 A | * | 6/1981 | Wimmer | ...................... 333/167 |
| 5,274,346 A | * | 12/1993 | Izu et al. | ...................... 333/184 |
| 6,593,840 B2 | * | 7/2003 | Morrison et al. | ............ 336/192 |
| 2004/0233015 A1 | * | 11/2004 | Tsai | ............................ 333/181 |
| 2009/0160580 A1 | * | 6/2009 | Hsieh et al. | .................. 333/185 |
| 2010/0142173 A1 | * | 6/2010 | Chen | ........................... 361/811 |

* cited by examiner

*Primary Examiner*—Tuyen Nguyen
(74) *Attorney, Agent, or Firm*—Birch, Stewart, Kolasch & Birch, LLP

(57) ABSTRACT

A filter mainly includes a coil connecting frame, a plurality of coils received in the frame, and a first circuit board. The frame comprises a first surface with a plurality of first pins and a second surface, opposite to the first surface, with a plurality of second pins. The first pins are connected to the first circuit board, and the second pins are connected to an external electronic device while both the first and second pins are connected to the coils. The coil connecting frame further includes an electrical connecting portion between the first surface and the second surface with a plurality of conducting pins which penetrate through the first and second surfaces to connect to the circuit board and the second pins or external electronic device.

20 Claims, 5 Drawing Sheets

FILTER AND COIL CONNECTING FRAME THEREOF

This Non-provisional application claims priority under U.S.C.§119(a) on Patent Application No(s). 095105316, filed in Taiwan, Republic of China on Feb. 17, 2006, the entire contents of which are hereby incorporated by reference.

BACKGROUND OF THE INVENTION

1. Field of the Invention

The invention relates to a filter and a coil connecting frame thereof, and in particular to a modulized filter and a coil connecting frame thereof.

2. Description of the Related Art

In order to manufacture electronic devices precisely, a surface mount device (SMD) is typically used in printed circuit boards to join electronic elements thereon. Conventionally, there are two methods of manufacturing magnetic elements described in the following.

One method of manufacturing conventional magnetic elements is winding a copper line on an iron core to form a coil, and one end of the coil is fixed on a pad of the printed circuit board by soldering. Also, a surface mount device (SMD) element is simultaneously attached to the printed circuit board. Pins for electrically connecting to an external apparatus are then fixed in insertion holes by soldering. The coil is covered with a silica gel. The printed circuit board and the electronic elements thereon are finally packaged by an epoxy resin.

However, as the density of the coil increases, the number of coils which require soldering increases. Because the coils are manually soldered, increasing the number of coils becomes difficult. Soldering must be performed several times to fix all the coils, which causes time consuming and decreases magnetic element quality. Moreover, the pins are manually inserted into the insertion holes. As the density of the coil increases, the number of manually inserted pins also increases, resulting in difficult assembly such as length inconsistency of the pins or tilted angles of the pins. Moreover, the gluing of the magnetic elements is performed manually so that the amount of the glue is difficult to ensure its uniformity, thereby reducing quality of the products. When the wrong percentage of the glue is used to package the magnetic elements, the poor quality suffers.

Another method of manufacturing conventional magnetic elements is winding a copper line on an iron core to form a coil, and then the coil is embedded within a lead frame so as to form a surface mount device (SMD) transformer module. The surface mount device (SMD) transformer module and related electronic elements are attached on the printed circuit board. Pins for electrically connecting to an external apparatus are then fixed in insertion holes by soldering. Finally, a shell to contain the printed circuit board is packaged by gluing.

However, because the solder contains a high lead content, thus these kinds of surface mount device (SMD) transformer modules do not comply with environmental regulation requirements. Recently, high density electronic elements are disposed in electronic devices to limit the size of the surface mount device (SMD) transformer module, which results in low reliability, low yielding, high cost and frequent failure of the surface mount device (SMD) transformer module. Similarly, high density electronic elements reduce the interval between two pins, thus increasing the possibility of electrical failure and reducing high voltage resistance.

In view of this, it is one important subject of the invention to provide a filter and a coil connecting frame to solve abovementioned problems.

BRIEF SUMMARY OF INVENTION

A detailed description is given in the following embodiments with reference to the accompanying drawings. The invention provides a modulized filter including a plurality of filter monomers capable of replacing a conventional unitary filter. When one of the filter monomers failures, only the broken monomer needs to be exchanged for a new one.

The filter of the invention includes at least a coil connecting frame, a plurality of coils and a first circuit board. The coil connecting frame includes a first surface and a second surface opposite to the first surface. The first surface includes a plurality of first pins to be electrically connected to the first circuit board. The second surface includes a plurality of second pins to connect to external apparatuses or elements. The coil connecting frame further includes an electrically connecting portion which is disposed between the first surface and the second surface to divide the coil connecting frame into two sections. The electrical connecting portion includes a plurality of conducting pins penetrating through and protruding from the first surface and the second surface for electrically connecting to the first circuit board or external electronic elements. Each section contains at least one coil. Each coil includes a plurality of lead wires to connect to the first pins and the second pins. Some of the second pins are primary pins and the other pins are secondary pins.

The first surface and the second surface respectively include a plurality of grooves for guiding and protecting the lead wires. The lead wires are fixed on the first pins and the second pins by soldering, clipping, winding or wave soldering. The coil connecting frame is filled with glue to protect and fix the coils.

The first circuit board includes a plurality of first insertion holes for electrically connecting and allowing the first pins and the conducting pins to be penetrated therethrough. Preferably, a solder is disposed between the first pins, the conducting pins and the first insertion holes by soldering.

The filter further includes a second circuit board. The second circuit board includes a plurality of second insertion holes for electrically connecting and allowing the second pins and the conducting pins to be penetrated therethrough.

Accordingly, the coil connecting frame forms a unitary filter monomer. The number of unitary monomers is determined by filter design requirements. When one of the unitary monomers failures, only the broken monomer needs to be exchanged for a new one but the entire filter does not require exchange. Moreover, the unitary monomer can be tested during the manufacturing process so that the yield and good rate of the finished products can be increased.

Compared with a conventional method of manufacturing a coil, the coil connecting frame of the invention includes grooves for protecting and guiding the lead wires. Eliminating manual soldering by use of the coil connecting frame simplifies manual labor procedures to provide high quality soldering and improve the electrical connection. A manufacturer can use a machine insertion of the pins into the coil connecting frame rather than conventional manual labor, thus preventing slanting pins and different pin lengths, thus efficiency is increased. The coils of the invention are disposed in the coil connecting frame and other electronic elements are disposed on a circuit board outside the coil connecting frame to efficiently isolate electric current.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
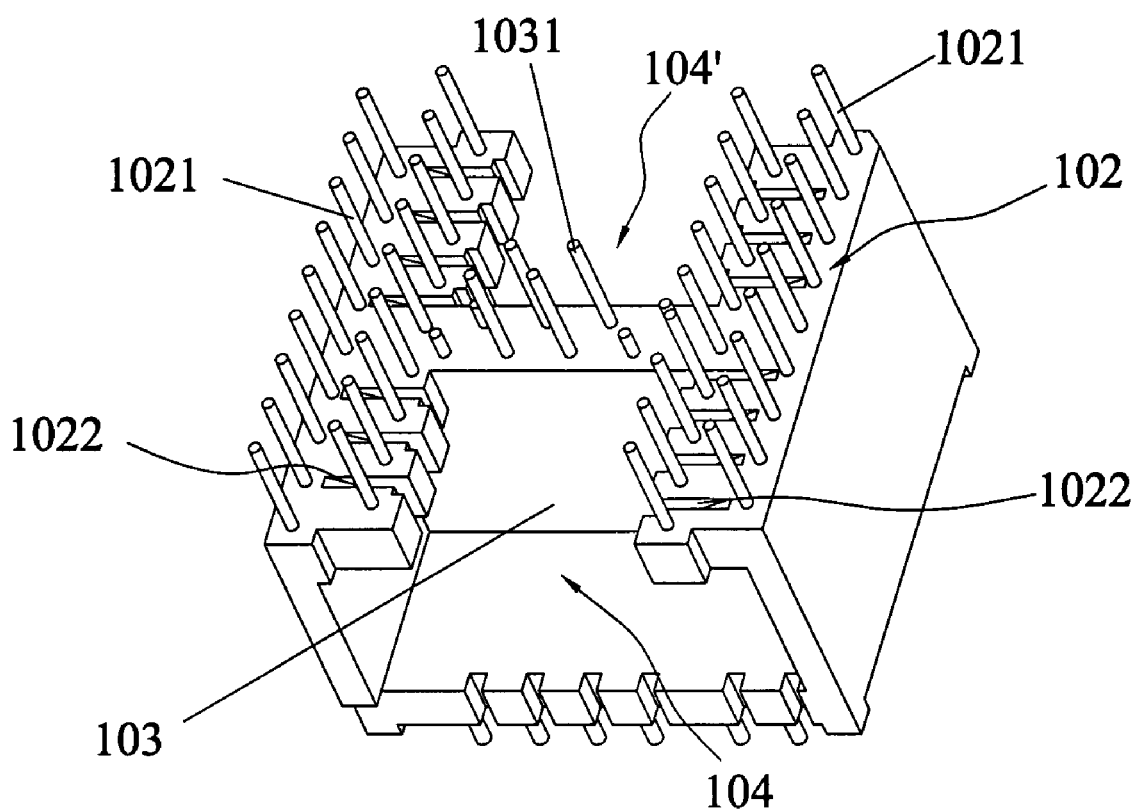
FIG. 1 is a schematic view of a coil connecting frame according to the preferred embodiment of the present invention.
Figure 2:
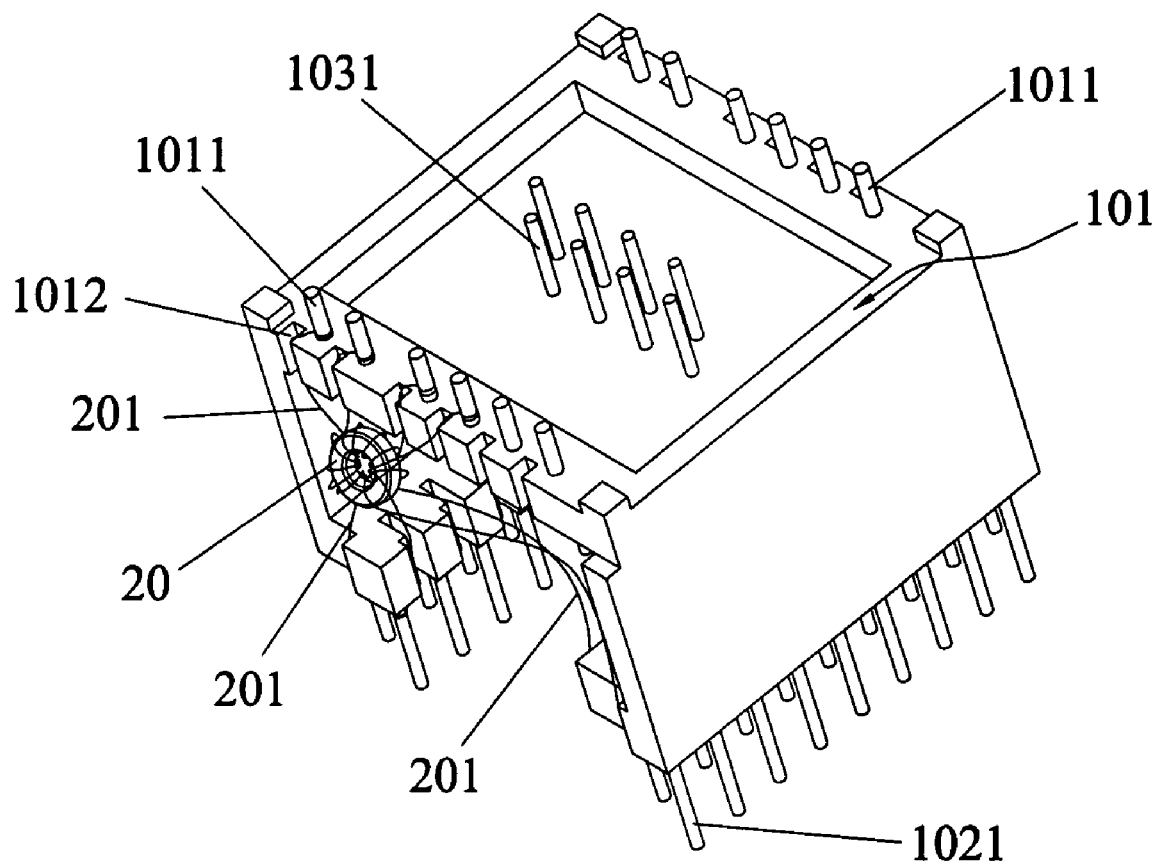
FIG. 2 is a schematic view of the coil connecting frame in FIG. 1 containing a coil from another viewpoint.

Referring to FIGS. 1 and 2, the coil connecting frame 10 includes a first surface 101 and a second surface 102. The first surface 101 is opposite to the second surface 102. The first surface 101 includes a plurality of first pins 1011 disposed thereon. The second surface 102 includes a plurality of second pins 1021 disposed thereon. The coil connecting frame 10 further includes an electrically connecting portion 103 disposed between the first surface 101 and the second surface 102 to divide the coil connecting frame 10 into two sections 104 and 104'. The electrically connecting portion 103 includes a plurality of conducting pins 1031 penetrating through both the first surface 101 and the second surface 102 and protruding from the first surface 101 and the second surface 102.

There are a plurality of first grooves 1012 disposed on the first surface 101 of the coil connecting frame 10, and the first grooves 1012 correspond to the first pins 1011. Also, there are a plurality of second grooves 1022 disposed on the second surface 102 of the coil connecting frame 10, and the second grooves 1022 correspond to the second pins 1021.

FIG. 1 shows that the second pins 1021 may be divided into two groups, one group is disposed on one side of the second surface 102 as primary pins of the coil, and the other group is disposed on the other opposing side of the second surface 102 as secondary pins of the coil. In other words, the group of second pins 1021 is respectively disposed on two opposite sides of the second surface 102 of the electrically connecting portion 103. Each group of the second pins 1021 are regularly arranged in rows. In this embodiment, the groups of the second pins 1021 are regularly arranged in two rows.

The sections 104 and 104' contain at least a coil 20. In a simple example, one coil 20 is disposed in the section 104 of the coil connecting frame 10. The coil 20 includes a plurality of lead wires 201. According to demand, the lead wires 201 of the coil 20 respectively penetrate through the first grooves 1012 of the first surface 101 and the second grooves 1022 of the second surface 102, and connect to the first pins 1011 and the second pins 1021. The lead wires 201 are fixed on the first pins 1011 and the second pins 1021 by soldering, clipping or winding. Even after arrangement of the coil 20, the lead wires 201 are fixed by wave soldering to increase quality and efficiency, and to further ensure electric connection. The first and second grooves 1012 and 1022 guide and protect the coil 20. The second pins 1021 respectively disposed on the two sides of the second surface 102 are primary pins and secondary pins. The connection relationship between the lead wires 201, the primary pins and secondary pins are decided according to requirements. In this embodiment, the primary pins and secondary pins respectively are arranged in two rows.

Figure 3:
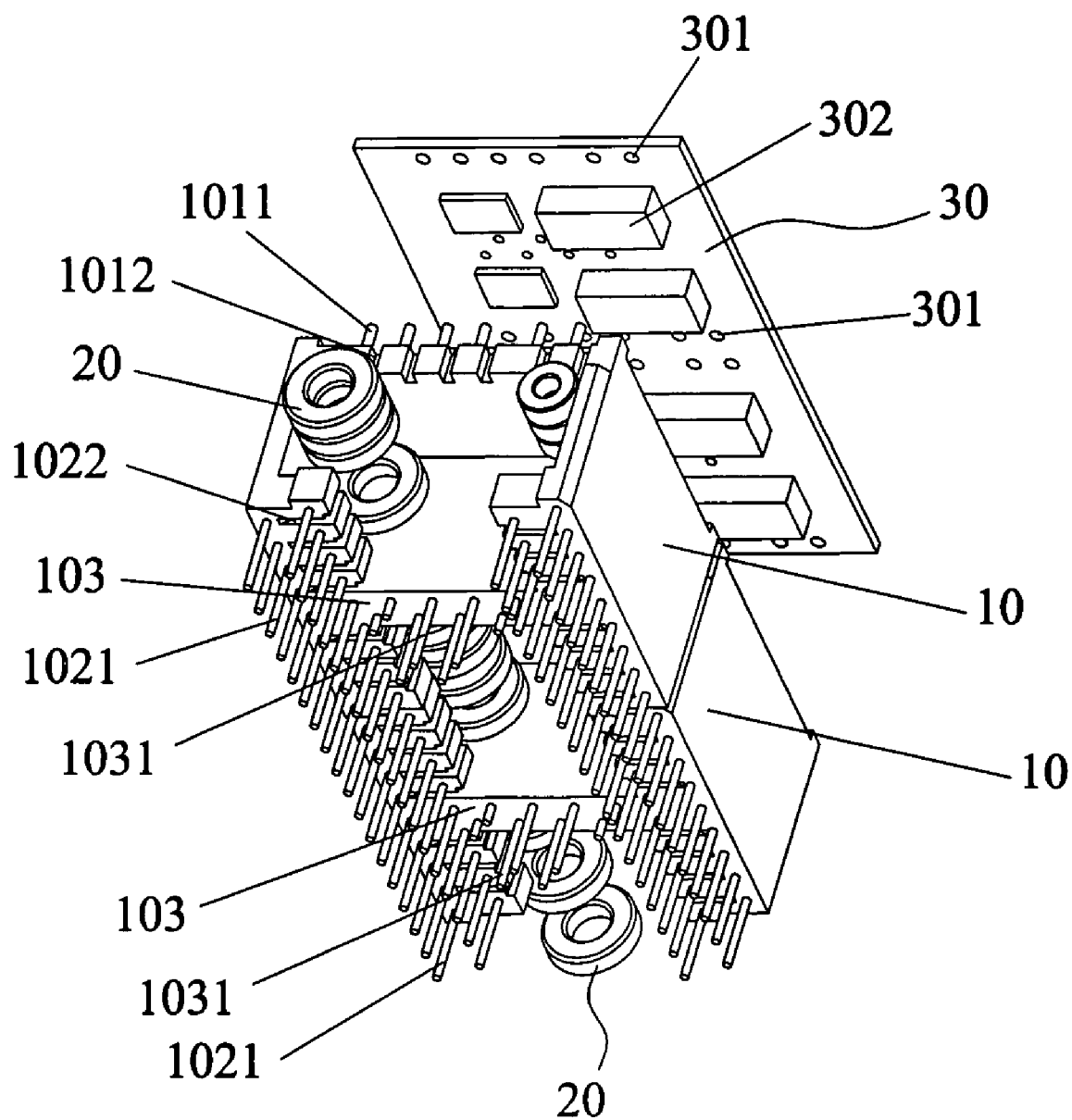
FIG. 3 is an exploded view of a filter according to the preferred embodiment of the present invention.
Figure 4:
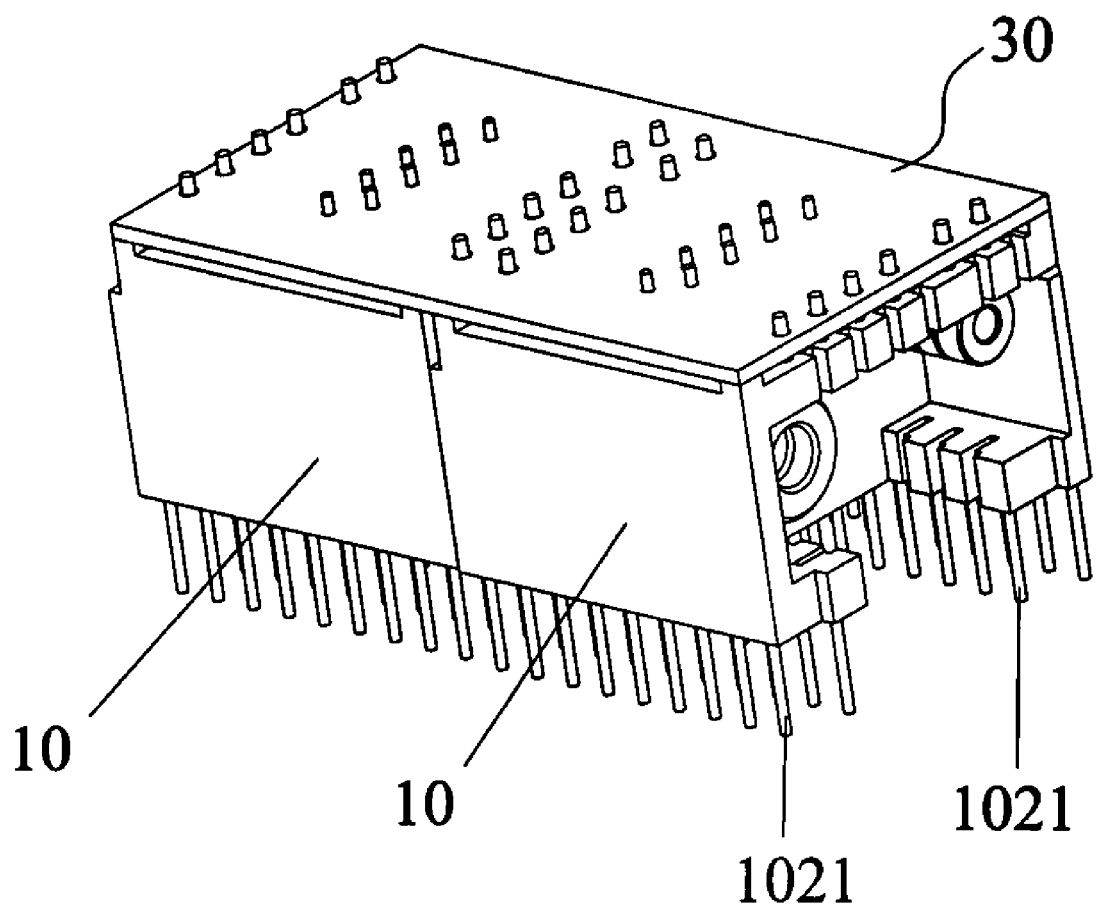
FIG. 4 is a schematic view of the filter in FIG. 3 from another viewpoint.

The coil connecting frame 10, the coil 20 mentioned as above joining with at least a circuit board can form a filter monomer. The number of the coil connecting frames 10 is decided according to requirement. FIGS. 3 and 4 show schematic views of a filter of the invention. The filter of the invention is a filter applied to local area network (LAN) or Ethernet. The filter 4 includes two coil connecting frames 10 disposed side by side and a first circuit board 30. The description of the coil connecting frame 10 is the same as previously described, thus, further description is omitted. The coils 20 are respectively disposed in the sections 104 and 104' of the coil connecting frames 10. The lead wires 201 are connected to the first pins 1011 and the second pins 1021 and protected by the first and second grooves 1012 and 1022 according to design. Further, glue is filled within the sections 104 and 104' so as to protect and fix the coil 20. The second pins 1021 are the primary pins and secondary pins for connecting to external apparatuses and electronic elements.

The first circuit board 30 includes a plurality of first insertion holes 301 to electrically connect to the first pins 1011 and the conducting pins 1031, protruding from the first surface 101. The conducting pins 1031 are fixed in the first insertion holes 301 by soldering. Moreover, the first circuit board 30 includes at least one necessary component, such as a surface mount device (SMD) element 302, for example, a high-voltage electric capacitor or a high-voltage electric resistor. The surface mount device (SMD) element 302, the circuit design therein, and the circuit design of the coil connecting frames 10 and the coils 20 provide a function of noise filtering.

Figure 5:
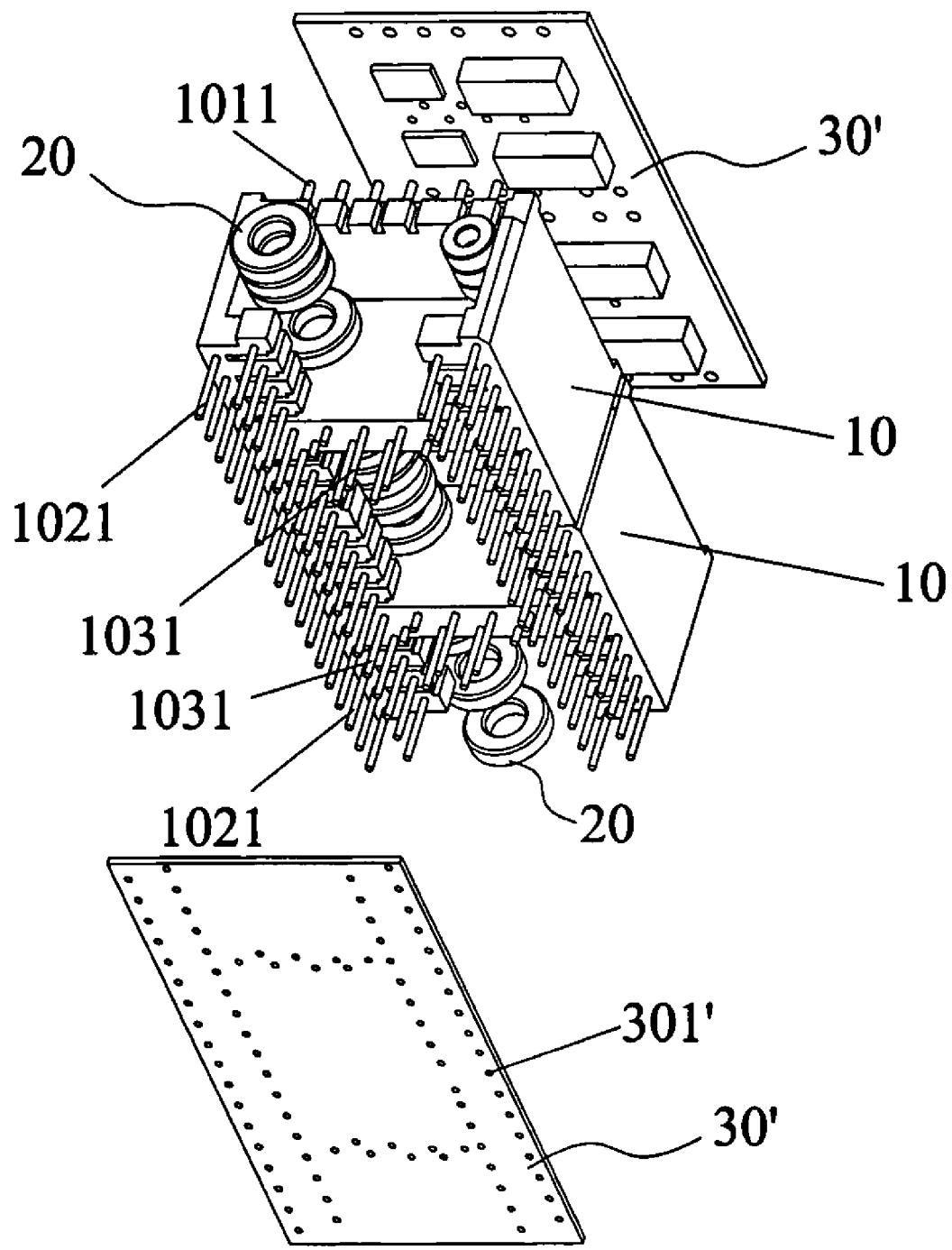
FIG. 5 is an exploded view of another filter according to the preferred embodiment of the present invention.

Moreover, the filter 4 further includes a second circuit board 30', as shown in FIG. 5. The second circuit board 30' includes a plurality of second insertion holes 301' connected to the second pins 1021 and the conducting pins 1031, protruding from the second surface 102 to electrically connect the first circuit board 30 and the second circuit board 30', wherein the second pins 1021 penetrate through and protrude from the second circuit board 30' to electrically connect to the external electronic elements.

Accordingly, each coil connecting frame forms a unitary filter monomer. The number of monomer is determined by filter design requirement. When one of the unitary monomers failures, only the broken monomer needs to be exchanged for a new one but the entire filter does not require exchange. Moreover, the unitary monomer can be tested during the manufacturing process so that the yield and good rate of the finished products can be increased.

Compared with a conventional method of manufacturing a coil, the coil connecting frame of the invention includes grooves for protecting and guiding the lead wires. Eliminating manual soldering by use of the coil connecting frame simplifies manual labor procedures to provide high quality soldering and improve the electrical connection. A manufacturer can use a machine insertion of the pins into the coil connecting frame rather than conventional manual labor, thus preventing slanting pins and different pin lengths, thus efficiency is increased. The coils of the invention are disposed in the coil connecting frame and other electronic elements are disposed on a circuit board outside the coil connecting frame to efficiently isolate electric current.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A coil connecting frame for a coil, comprising:
   a first surface;
   a plurality of first pins disposed on the first surface;
   a second surface;
   a plurality of second pins disposed on the second surface; and
   an electrically connecting portion comprising a plurality of conducting pins;
   wherein the first surface is opposite to the second surface, and the electrical connecting portion is disposed between the first surface and the second surface to divide the coil connecting frame into two sections.

2. The coil connecting frame as claimed in claim 1, wherein the conducting pins penetrate through the first surface and the second surface and protrude from the first surface and the second surface.

3. The coil connecting frame as claimed in claim 1, further comprising a plurality of first grooves corresponding to the first pins and a plurality of second grooves corresponding to the second pins, wherein the first grooves and the second grooves are located on the first surface and the second surface, respectively.

4. The coil connecting frame as claimed in claim 1, wherein the second pins are divided into two groups, one group is disposed on one side of the second surface as primary pins of the coil, and the other group is disposed on the other opposing side of the second surface as secondary pins of the coil.

5. The coil connecting frame as claimed in claim 4, wherein the groups of the second pins are regularly arranged in rows.

6. A filter, comprising:
   a coil connecting frame, comprising a first surface, a plurality of first pins disposed on the first surface, a second surface, a plurality of second pins disposed on the second surface, and an electrical connecting portion comprising a plurality of conducting pins; wherein the first surface is opposite to the second surface, and the electrical connecting portion is disposed between the first surface and the second surface to divide the coil connecting frame into two sections;
   a plurality of coils, respectively disposed in the two sections; and
   a first circuit board, connected to the first pins and the conducting pins.

7. The filter as claimed in claim 6, wherein each coil comprises a plurality of lead wires to connect to the first pins and the second pins, separately.

8. The filter as claimed in claim 7, wherein the lead wires are fixed on the first pins and the second pins by soldering, clipping, winding or wave soldering.

9. The filter as claimed in claim 6, wherein the second pins are divided into two groups, one group is disposed on one side of the second surface as primary pins of the coil, and the other group is disposed on the other opposing side of the second surface as secondary pins of the coil.

10. The filter as claimed in claim 9, wherein the groups of the second pins are regularly arranged in rows.

11. The filter as claimed in claim 10, further comprising a plurality of first grooves and a plurality of second grooves, wherein the first grooves and the second grooves are respectively located on the first surface and the second surface for guiding the lead wires.

12. The filter as claimed in claim 11, wherein the first grooves correspond to the first pins and the second grooves correspond to the second pins, and the first grooves are near the first pins and the second grooves are near the second pins.

13. The filter as claimed in claim 6, wherein the first circuit board comprises a plurality of first insertion holes for electrically connecting and allowing the first pins and the conducting pins to be penetrated therethrough.

14. The filter as claimed in claim 13, wherein the conducting pins are fixed in the first insertion holes by soldering.

15. The filter as claimed in claim 6, further comprising a second circuit board, comprising a plurality of second insertion holes electrically connecting and allowing the second pins and the conducting pins to be penetrated therethrough.

16. The filter as claimed in claim 15, wherein the conducting pins are fixed in the second insertion holes by soldering.

17. The filter as claimed in claim 15, wherein the conducting pins penetrate through and protrude from both the first circuit board and the second circuit board.

18. The filter as claimed in claim 6, wherein the first circuit board comprises at least a surface mount device (SMD) element, such as an electric capacitor or an electric resistor.

19. The filter as claimed in claim 6, further comprising a glue to be filled within the sections so as to protect and fix the coils.

20. The filter as claimed in claim 6, wherein the filter is applied to a local area network (LAN) or Ethernet.

* * * * *